(12) United States Patent
Li et al.

(10) Patent No.: US 11,287,453 B2
(45) Date of Patent: Mar. 29, 2022

(54) METHOD AND SYSTEM FOR MEASURING POWER-ON RESET TIME

(71) Applicant: SHENZHEN GOODIX TECHOLOGY CO., LTD., Guangdong (CN)

(72) Inventors: Qingbin Li, Guangdong (CN); Dekun Chen, Guangdong (CN)

(73) Assignee: Shenzhen Goodix Technology Co., Ltd., Shenzhen (CN)

( * ) Notice: Subject to any disclaimer, the term of this patent is extended or adjusted under 35 U.S.C. 154(b) by 777 days.

(21) Appl. No.: 16/166,682

(22) Filed: Oct. 22, 2018

(65) Prior Publication Data
US 2019/0086451 A1    Mar. 21, 2019

Related U.S. Application Data

(63) Continuation of application No. PCT/CN2017/102344, filed on Sep. 19, 2017.

(51) Int. Cl.
*G01R 19/175* (2006.01)
*G01R 19/165* (2006.01)
(Continued)

(52) U.S. Cl.
CPC ..... *G01R 19/175* (2013.01); *G01R 19/16576* (2013.01); *G01R 22/00* (2013.01); *G01R 29/02* (2013.01); *H03K 17/22* (2013.01)

(58) Field of Classification Search
CPC ...... G01R 19/175; G01R 22/00; G01R 29/02; G01R 19/16576; G01R 31/2191;
(Continued)

(56) References Cited

U.S. PATENT DOCUMENTS 5,365,481 A    11/1994 Sawada
5,450,417 A    9/1995 Truong et al.
(Continued)

FOREIGN PATENT DOCUMENTS

CN    101221205 A    7/2008
CN    101419522 A    4/2009
(Continued)

OTHER PUBLICATIONS

English translation for KR20080059049 A (Year: 2008).*
(Continued)

*Primary Examiner* — Patrick Assouad
*Assistant Examiner* — Byungro Ro Lee
(74) *Attorney, Agent, or Firm* — Heslin Rothenberg Farley & Mesiti, PC (57) ABSTRACT

A method for measuring a power-on reset time includes: detecting a power supply pin voltage of a chip, and recording a time point at which the power supply pin voltage reaches a preset voltage as a first time point; detecting an output signal of a preset pin of the chip, and recording a time point at which the preset pin completes a pulse output for a first time after the chip is powered on, as a second time point, and recording a time point the preset pin completes a pulse output for a second time, as a third time point; wherein widths of the pulse output for the first time and for the second time are the same; and computing the power-on reset time of the chip according to the first time point, the second time point and the third time point.

16 Claims, 4 Drawing Sheets

(51) Int. Cl.
*H03K 17/22* (2006.01)
*G01R 29/02* (2006.01)
*G01R 22/00* (2006.01)

(58) Field of Classification Search
CPC .......... G01R 27/26; H03K 17/22; H03K 5/00; H03K 3/011; H03F 3/45475; H03F 2200/261; G11C 16/20; G11C 16/30; G11C 5/143; G11C 7/222; G11C 7/20; G11C 16/32; H02M 1/4208
USPC .............................................. 702/79
See application file for complete search history.

(56) References Cited

U.S. PATENT DOCUMENTS

| | | | | |
|---|---|---|---|---|
| 6,181,583 | B1 * | 1/2001 | Okui | H02M 1/4208 363/45 |
| 8,508,215 | B2 * | 8/2013 | Haevescher | G01R 27/26 324/111 |
| 2003/0142572 | A1 * | 7/2003 | Ishida | H03K 17/22 365/226 |
| 2007/0101166 | A1 | 5/2007 | Boyum et al. | |
| 2007/0266280 | A1 | 11/2007 | Ng et al. | |
| 2010/0207890 | A1 | 8/2010 | Chen | |
| 2015/0362541 | A1 * | 12/2015 | Peng | G01R 27/28 702/79 |
| 2017/0168100 | A1 | 6/2017 | Chang et al. | |

FOREIGN PATENT DOCUMENTS

| | | | | | |
|---|---|---|---|---|---|
| CN | 101512360 | A | | 8/2009 | |
| CN | 101753212 | A | | 6/2010 | |
| CN | 101799734 | A | | 8/2010 | |
| CN | 102111136 | A | | 6/2011 | |
| CN | 102480283 | A | | 5/2012 | |
| CN | 102968217 | A | | 3/2013 | |
| CN | 103197998 | A | | 7/2013 | |
| CN | 103458073 | A | | 12/2013 | |
| CN | 203537424 | U | | 4/2014 | |
| CN | 103793032 | A | | 5/2014 | |
| CN | 104345849 | A | | 2/2015 | |
| CN | 104463107 | A | | 3/2015 | |
| CN | 105116316 | A | | 12/2015 | |
| CN | 105550664 | A | | 5/2016 | |
| CN | 105556443 | A | | 5/2016 | |
| CN | 105676105 | A | | 6/2016 | |
| CN | 205484701 | U | | 8/2016 | |
| CN | 106324395 | A | | 1/2017 | |
| CN | 106339662 | A | | 1/2017 | |
| CN | 106374896 | A | | 2/2017 | |
| CN | 106489109 | A | | 3/2017 | |
| CN | 206515844 | U | | 9/2017 | |
| JP | S61257085 | A | | 11/1986 | |
| JP | 2002117393 | A | | 4/2002 | |
| KR | 20040008332 | A | * | 1/2004 | ........... H03K 17/223 |
| KR | 20080059049 | A | * | 6/2008 | ............. G11C 16/20 |
| WO | 2014151812 | A2 | | 9/2014 | |

OTHER PUBLICATIONS

English translation for KR20040008332 A (Year: 2004).*
Cao, Z., et al., "Design of Power-On Reset Circuit Supporting Wide-Range Power-On Time", Electronics & Packaging, vol. 17, No. 7, pp. 28-30, 35 (2017), English abstract.
Extended European Search Report for European Application No. 17905017.4 dated Aug. 28, 2019.

* cited by examiner

METHOD AND SYSTEM FOR MEASURING POWER-ON RESET TIME

CROSS REFERENCE TO RELATED APPLICATIONS

The present disclosure is a continuation of International Application No. PCT/CN2017/102344, filed on Sep. 19, 2017, which application is hereby incorporated by reference herein, in its entirety.

TECHNICAL FIELD

The present disclosure relates to circuit technologies, and particularly relates to a method and a system for measuring a power-on reset time.

BACKGROUND

In an existing computer or an embedded processor, a digital logic unit thereof shall be configured in a reasonable state before a system is started. When a processor chip is powered on, a working voltage needed by the chip cannot reach a preset voltage value immediately. If the voltage that does not reach the preset voltage value is immediately used in a digital circuit, it would often lead to an unclear start state of the digital circuit in the chip. Therefore, a power on reset (POR for short) circuit is needed to load the system of the processor into an initial state, so that the processor chip starts an operation (i.e., starts executing instructions) from a reasonable state after each power-on; that is, the processor chip performs operation after that a clock and an external voltage of the processor are gradually stabilized, and a value of a register in the chip is correctly reset. An existing power-on reset circuit needs to be verified to confirm whether the power-on reset circuit can successfully load the system of the processor into the initial state.

As an integration level of the chip increases, the power-on reset circuit is generally integrated into the processor chip to reduce product cost, and the power-on reset circuit starts to work after the chip is powered on. The inventor found that at least following technical problems exist in existing technologies: for the power-on reset circuit which is integrated into the processor chip, a maximum power-on reset time is generally set for verification upon verifying the power-on reset circuit since it is difficult to obtain accurate power-on reset time, which results in long verification time and low verification efficiency.

SUMMARY

An objective of some embodiments of the present disclosure is to provide a method and a system for measuring a power-on reset time, which can accurately measure the power-on reset time, and improve verification efficiency of a power-on reset circuit.

An embodiment of the present disclosure provides a method for measuring power-on reset time, including: detecting a power supply pin voltage of a chip, and recording a time point at which the power supply pin voltage reaches a preset voltage as a first time point; detecting an output signal of a preset pin of the chip, and recording a time point at which a completion of a first pulse output of the detected output signal is detected for a first time after the chip is powered on as a second time point, and recording a time point at which a completion of a second pulse output of the detected output signal is detected for a second time after the chip is powered on as a third time point; wherein a width of the first pulse output for the first time and a width of the second pulse output for the second time are the same; computing the power-on reset time of the chip according to the first time point, the second time point and the third time point.

An embodiment of the present disclosure further provides a system for measuring a power-on reset time, including: a detecting device and a computing device; the detecting device is used for detecting a power supply pin voltage of a chip, and recording a time point at which the power supply pin voltage reaches a preset voltage as a first time point; the detecting device is also used for detecting an output signal of a preset pin of the chip, and recording a time point at which a completion of a first pulse output of the detected output signal is detected for a first time after the chip is powered on as a second time point, and recording a time point at which a completion of a second pulse output of the detected output signal is detected for a second time after the chip is powered on as a third time point; wherein a width of the first pulse output for the first time and a width of the second pulse output for the second time are the same; the computing device is used for computing the power-on reset time of the chip according to the first time point, the second time point and the third time point.

An embodiment of the present disclosure further provides a system for measuring a power-on reset time, including: at least one processor and a memory that communicates with the at least one processor; the memory stores instructions executable by the at least one processor, and the instructions executed by the at least one processor to enable the at least one processor to execute the above method for measuring the power-on reset time.

Compared with existing technologies, in the embodiment of the present disclosure, the power supply pin voltage of the chip is detected, and the time point at which it is detected that the power supply pin voltage reaches the preset voltage is recorded as the first time point. At this time, the power-on reset circuit in the chip is triggered. After the power-on reset time, the time point at which completion of the first pulse output for the first time may be detected and recorded as the second time point, and the time point at which a completion of the second pulse output for the second time is recorded as the third time point (widths of the first and second pulses outputs for the first time and for the second time are the same). Then, according to a relationship among the first time point, the second time point, and the third time point, the power-on reset time can be accurately measured, and verification efficiency of the power-on reset circuit is improved.

Additionally, according to the relationship among the first time point, the second time point, and the third time point, the power-on reset time is computed, which specifically includes: computing the power-on reset time of the chip according to a formula $T(P)=(T_2-T_1)-(T_3-T_2)$; $T(P)$ is the power-on reset time of the chip, $T_1$ is the first time point, $T_2$ is the second time point, and $T_3$ is the third time point. In the present embodiment, the specific formula for computing the power-on reset time is provided.

Additionally, the power-on reset time is corrected according to a reset trigger time of the power-on reset circuit, after the power-on reset time of the chip is computed. In the present embodiment, the power-on reset time is corrected according to the reset trigger time of the power-on reset circuit, thereby further improving accuracy of the computed power-on reset time.

Additionally, the reset trigger time of the power-on reset circuit is a preset value. In the present embodiment, a specific implementation for obtaining the reset trigger time of the power-on reset circuit is provided.

Additionally, a time point at which the power supply pin voltage appears is recorded as a fourth time point during a process of detecting the power supply pin voltage of the chip; the power-on reset time is corrected specifically by: computing a time difference between the first time point and the fourth time point; taking the computed time difference as the reset trigger time of the power-on reset circuit to correct the power-on reset time. In the present embodiment, another specific implementation for obtaining the reset trigger time of the power-on reset circuit is provided.

BRIEF DESCRIPTION OF THE DRAWINGS

One or more embodiments are exemplarily described with reference to corresponding figures in accompanying drawings, and these exemplary descriptions do not constitute a limitation to the embodiments. Elements with the same reference numerals in the accompanying drawings represent similar elements. The figures in the accompanying drawings do not constitute a proportion limitation unless otherwise stated.

DETAILED DESCRIPTION

In order to make objectives, technical solutions and advantages of the present disclosure clearer, some embodiments of the present disclosure will be explained below in detail with reference to accompanying drawings and examples. It should be understood that the specific embodiments described herein only explain the present disclosure but not limit the present disclosure.

A first embodiment of the present disclosure relates to a method for measuring a power-on reset time, which is applied to a system for measuring the power-on reset time, to measure the power-on reset time of a power-on reset circuit integrated into a chip, but is not limited thereto. Before measuring, a pulse output program needs to be written in a storage device or an external flash memory of the chip. The program is designed with a pulse output instruction as a first instruction to be executed after the chip is powered on. After the chip is powered on and after the power-on reset time, the chip executes the pulse output instruction, and outputs a pulse with a preset width through a general purpose input/output (GPIO) of the chip. The pulse output program is also designed with a jump instruction, which may enable the chip to jump to execute the first instruction when powered on, to re-execute the pulse output program, after the chip completes executing the pulse output program. The pulse output program may be bootloaded by a Bootloader of the chip (a small program running before the operating system kernel runs), or directly programed into an external executable flash memory and runs directly, and the chip is connected to the executable flash memory via an external bus.

Figure 1:
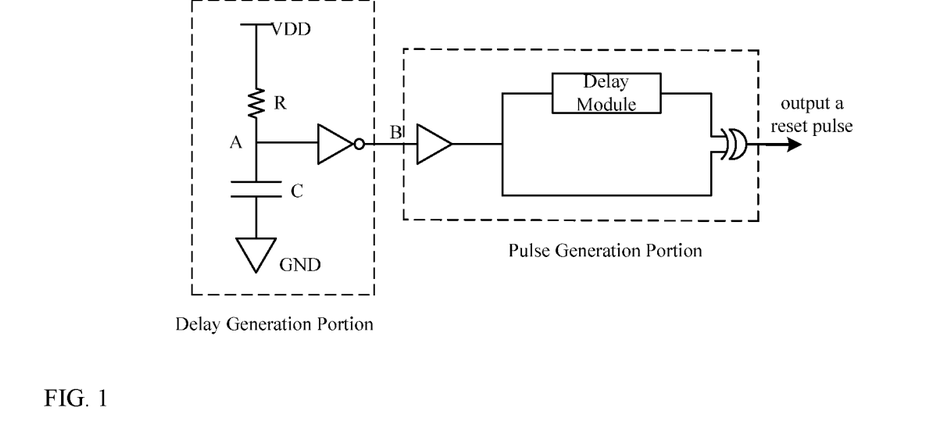
FIG. 1 is a circuit diagram of a power-on reset circuit according to a first embodiment of the present disclosure.

FIG. 1 shows the power-on reset circuit including a delay generation portion and a pulse generation portion. The delay generation portion of the power-on reset circuit includes a resistor R, a capacitor C and an inverter, and the pulse generation portion includes a delay module and a XOR gate. The power-on reset circuit is integrated into the chip, and a power supply is connected to a power pin of the chip. When the power supply is turned on to power on the chip, a power supply pin voltage VDD rises with a power supply voltage, and the power supply pin voltage VDD acts on the power-on reset circuit. The capacitor C starts to charge, and a voltage at a point A starts to rise. When the voltage at the point A reaches a trigger voltage of the inverter, a voltage at a point B is reversed, and the pulse generation portion outputs a reset pulse.

The power-on reset time of the power-on reset circuit theoretically should include a reset trigger time and a reset pulse width time; however, the reset pulse width time is much longer than the reset trigger time, thus within the allowed error range of power-on reset circuit verification, the reset pulse width time of the power-on reset circuit may be directly taken as the power-on reset time in order to simplify the measurement.

Figure 2:
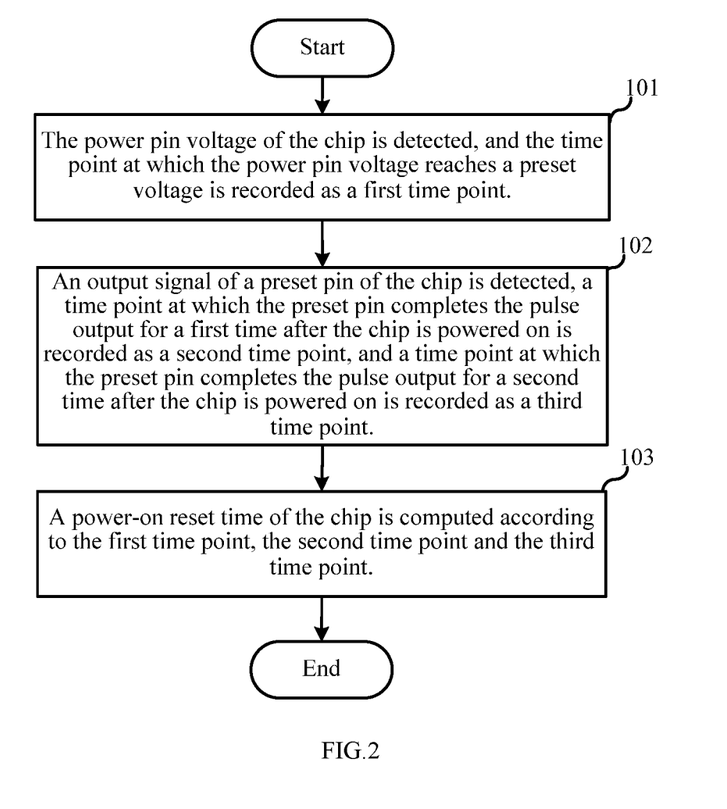
FIG. 2 is a specific flowchart of a method for measuring a power-on reset time according to the first embodiment of the present disclosure.

This embodiment exemplifies that the reset pulse width time is taken as the power-on reset time. FIG. 2 shows a specific process of the method for measuring the power-on reset time according to this embodiment.

At step 101, the power supply pin voltage of the chip is detected, and a time point at which the power supply pin voltage reaches a preset voltage is recorded as a first time point.

In the present embodiment, the power supply pin voltage of the chip may be detected by a detecting device. The detecting device may be, for example, an oscilloscope or a logic analyzer. However, a specific type of the detecting device is not limited in this embodiment.

Figure 3:
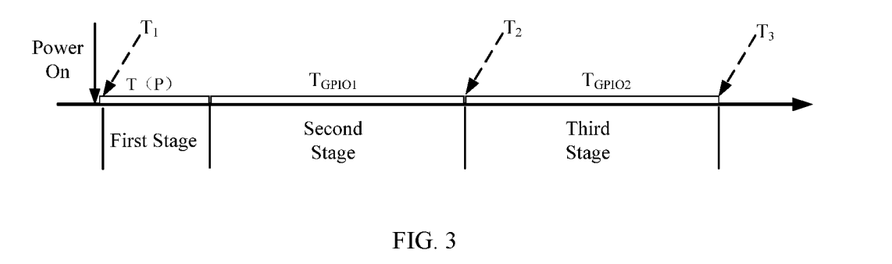
FIG. 3 is a diagram of a process for measuring an entire power-on reset time according to the first embodiment of the present disclosure.

Specifically, before the chip is powered on, a probe of the detecting device is connected to the power supply pin of the chip for detecting the power supply pin voltage; after the chip is powered on, the power supply pin voltage of the chip gradually rises from 0V. The time point, at which the detecting device detects that the power supply pin voltage reaches and stabilizes at the preset voltage, is recorded as the first time point $T_1$. FIG. 3 shows a diagram of each time point detected during the entire process of measuring the power-on reset time.

At step 102, an output signal of a preset pin of the chip is detected, and a time point at which a completion of a first pulse output of the detected output signal is detected for a first time after the chip is powered on is recorded as a second time point, and a time point at which a completion of a second pulse output of the detected output signal is detected for a second time after the chip is powered on is recorded as a third time point.

Specifically, when the power supply pin voltage reaches and stabilizes at the preset voltage, the power-on reset circuit is triggered. After the power-on reset time, the chip performs the pulse output instruction and outputs a pulse signal from the preset pin (any GPIO), and the output signal of the preset pin of the chip is detected by the detecting device.

Before power on, when one probe of the detecting device is connected to the power supply pin of the chip, another probe of the detecting device is connected to the preset pin to detect the output signal of the preset pin. After the chip is powered on, the time point at which a completion of a first pulse output of the detected output signal is detected for the first time is recorded as the second time point $T_2$. Then, the chip executes the jump instruction and jumps to the first instruction (i.e., the pulse output instruction) for re-execution, and the time point at which a completion of a second pulse output of the detected output signal is detected for the second time is recorded as the third time point $T_3$. Since the chip executes the same pulse output instruction, the width of the first pulse output for the first time is the same with that of the second pulse output for the second time.

At step 103, a power-on reset time of the chip is computed according to the first time point, the second time point and the third time point.

Specifically, with reference to FIG. 3, the entire process of measuring the power-on reset time includes three stages: a first stage refers to a power-on reset time T(P); a second stage refers to a time $T_{GPIO1}$ from a time point that the chip executes the pulse output instruction to a time point that the chip completes the pulse output for the first time; a third stage refers to a time $T_{GPIO2}$ from a time point that the chip executes the pulse output instruction to a time point that the chip completes the pulse output for the second time.

According to each time point detected by the detecting device, the following may be obtained: the total time for completing the first and second stages during the entire process for measuring the power-on reset time, i.e., T(P)+$T_{GPIO1}$=$T_2$-$T_1$; the time for completing the third stage, i.e., $T_{GPIO2}$=$T_3$-$T_2$. Since the same pulse output instructions are executed in the second stage and the third stage respectively, the time to complete the second stage is equal to the time to complete the third stage, that is, $T_{GPIO1}$=$T_{GPIO2}$. Therefore, the power-on reset time of the chip may be computed according to a formula T(P)=($T_2$-$T_1$)-($T_3$-$T_2$); T(P) is the power-on reset time of the chip, $T_1$ is the first time point, $T_2$ is the second time point, and $T_3$ is the third time point.

Compared with existing technologies, in the embodiment of the present disclosure, via software, the power supply pin voltage of the chip is detected, and the time point at which the power supply pin voltage reaches the preset voltage is recorded as the first time point. At this time, the power-on reset circuit in the chip is triggered, and after the power-on reset time, the time point at which the completion of the first pulse output of the detected output signal is detected for the first time may be detected and recorded as the second time point, and the time point at which the completion of the second pulse output of the detected output signal is detected for the second time as the third time point (widths of the first and second pulse outputs for the first time and for the second time are the same). Then, according to the relationship among the first time point, the second time point and the third time point, the power-on reset time may be measured more accurately, thereby improving the verification efficiency of the power-on reset circuit.

A second embodiment of the present disclosure relates to a method for measuring a power-on reset time. The present embodiment improves the first embodiment mainly in correcting the power-on reset time computed in the first embodiment according to a reset trigger time of the power-on reset circuit.

Figure 4:
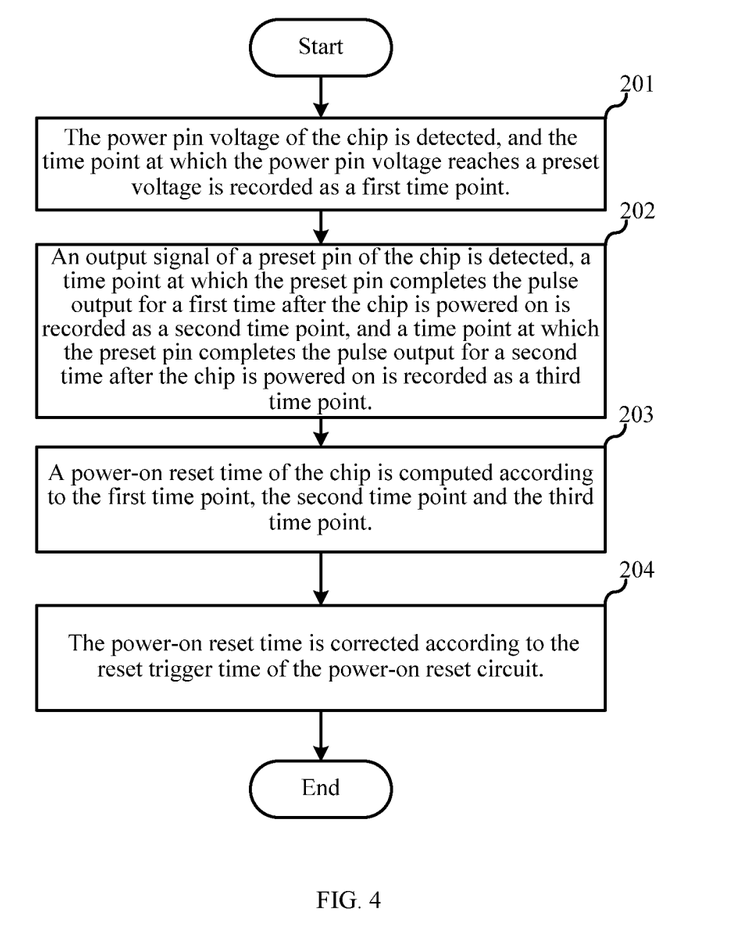
FIG. 4 is a specific flowchart of a method for measuring the power-on reset time according to a second embodiment of the present disclosure.

FIG. 4 shows a specific process of the method for measuring the power-on reset time in the present embodiment.

Steps 201 to 203 are generally the same with steps 101 to 103 and thus will not be repeated herein. A main difference lies in an additional step 204, which is specifically as follows.

At step 204, the power-on reset time is corrected according to the reset trigger time of the power-on reset circuit.

Specifically, in the first embodiment, the computed power-on reset time is actually a reset pulse width time of the power-on reset circuit, but the reset trigger time of the power-on reset circuit is not considered. In this embodiment, the power-on reset time is corrected according to the reset trigger time of the power-on reset circuit to meet a requirement for higher precision. A specific way for the correction is to add the power-on reset time computed in the first embodiment with the reset trigger time to get a corrected power-on reset time.

In this embodiment, there are two specific ways to obtain the reset trigger time of the power-on reset circuit.

In a first way, the reset trigger time of the power-on reset circuit is preset to a preset value, and the corrected power-on reset time is obtained by adding the computed power-on reset time with the preset value. The preset value may be preset in a chip as a default setting, and different preset values need to be set for different types of chips.

Figure 5:
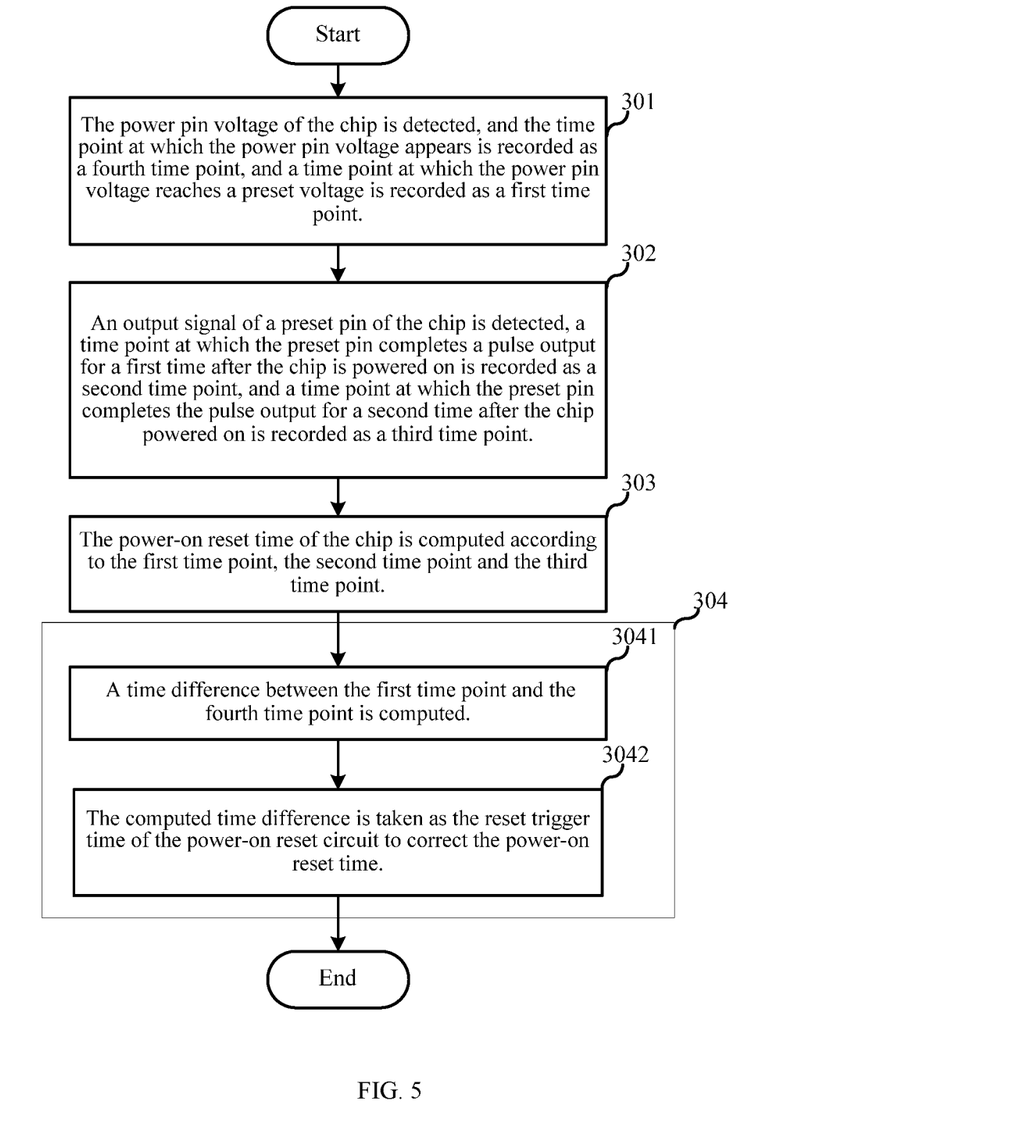
FIG. 5 is a specific flowchart of a method for measuring the power-on reset time according to a reset trigger time obtained in a second manner, according to the second embodiment of the present disclosure.

In a second way, the reset trigger time is computed by detecting time points of the power supply pin voltage of the chip. When the second way is applied to obtain the reset trigger time, a specific process of the method for measuring the power-on reset time is shown in FIG. 5.

Steps 302 and 303 are generally the same with steps 202 and 203 and thus will not be repeated herein. A main difference lies as below.

At step 301, the power supply pin voltage of the chip is detected, and a time point at which the power supply pin voltage appears is recorded as a fourth time point, and the time point at which the power supply pin voltage reaches the preset voltage is recorded as the first time point.

Specifically, the power supply pin voltage of the chip is detected by a detecting device. In this embodiment, before the chip is powered on, the power supply pin voltage detected by the detecting device is 0V, and the power supply pin voltage detected by the detecting device rises with a power supply voltage after power on. Therefore, the time point, at which the detecting device detects the power supply pin voltage appears (i.e., rises from 0V), is recorded as the fourth time point $T_4$. In the present embodiment, however, how the voltage values change before and after power on is not limited. For example, the detected power supply pin voltage may be −2V before power on, while the detected power supply pin voltage may gradually rise from −2V and stabilize at the preset voltage (e.g., the preset voltage may be 3V) after power on.

At step 302, an output signal of the preset pin of the chip is detected, and the time point at which a completion of a first pulse output of the detected output signal is detected for the first time after the chip is powered on is recorded as a second time point, and the time point at which a completion of a second pulse output of the detected output signal is detected for the second time after the chip is powered on is recorded as a third time point.

At step 303, the power-on reset time of the chip is computed according to the first time point, the second time point and the third time point.

At step 304, the power-on reset time is corrected according to the reset trigger time of the power-on reset circuit, specifically including the following steps.

At step 3041, a time difference between the first time point and the fourth time point is computed.

Specifically, the time difference, i.e., $T_1-T_4$, between the first time point $T_1$ and the fourth time point $T_4$ may be computed according to the first time point $T_1$ and the fourth time point $T_4$ recorded by the detecting device. The time difference is a time for the power supply pin voltage of the chip rises from 0V to reach and stabilize the preset voltage.

At step 3042, the computed time difference is taken as the reset trigger time of the power-on reset circuit to correct the power-on reset time.

Figure 6:
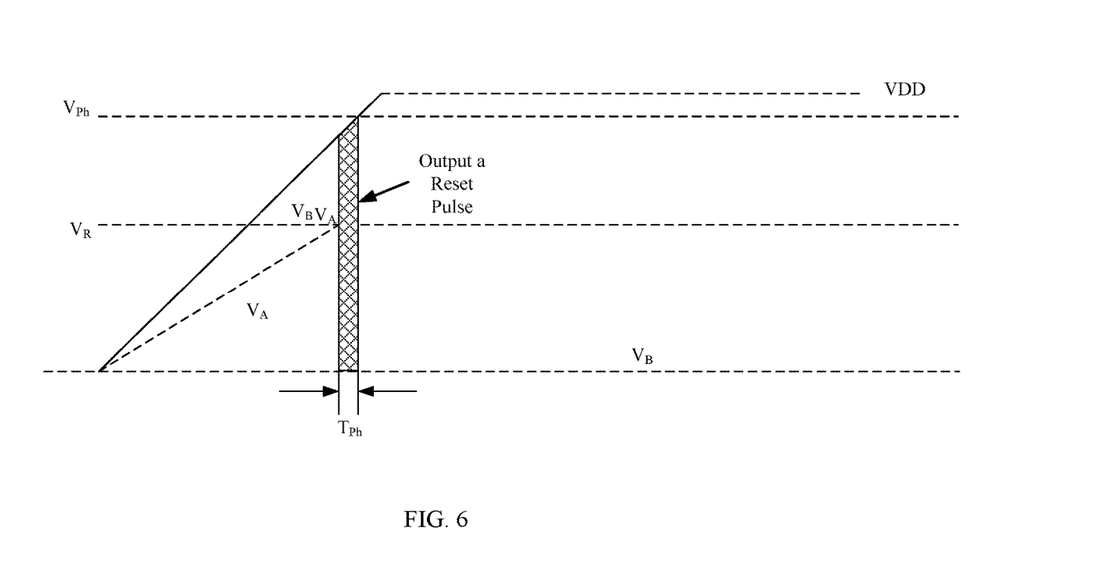
FIG. 6 is a power-on sequence diagram of a chip according to the second embodiment of the present disclosure.

Specifically, FIG. 6 shows a power-on sequence diagram of the chip including the power-on reset circuit in FIG. 1. $V_A$ represents a voltage at a point A, $V_B$ represents a voltage at a point B, $V_R$ represents a reversed voltage of the inverter in the power-on reset circuit, VDD represents the power supply pin voltage, $V_{Ph}$ represents a trigger voltage of the power-on reset circuit, and $T_{Ph}$ is a stabilization time of the power-on reset circuit. After the chip is powered on, in the power-on reset circuit, the voltage $V_A$ at the point A gradually rises to reach the trigger voltage $V_R$ of the inverter, and the voltage $V_B$ at the point B is reversed. After the stabilization time $T_{Ph}$ of the circuit, a voltage input to the power-on reset circuit (i.e., the power supply pin voltage VDD) reaches $V_{Ph}$. At this time, the pulse generation portion of the power-on reset circuit outputs a reset pulse, and then the power supply pin voltage VDD gradually rises and stabilizes at the preset voltage. The reset trigger time of the power-on reset circuit is a time length between a power-on time point and a time point at which the power supply pin voltage VDD reaches $V_{Ph}$ (i.e., a time point at which the power-on reset circuit outputs the reset pulse). It is seen from FIG. 6 that the reset trigger time is generally less than the time for the power supply pin voltage of the chip gradually rises from 0V to reach and stabilize at the preset voltage, but a time difference between the time point at which the power-on reset circuit outputs the reset pulse and the time point $T_1$ at which the power supply pin voltage stabilizes at the preset voltage is so little as to be ignored. Accordingly, the time for the power supply pin voltage of the chip gradually rises from 0V to reach and stabilize at the preset voltage may be taken as the reset trigger time, that is, the reset trigger time of the power-on reset circuit is $T_1-T_4$. Then, the power-on reset time computed at step 303 is added with the reset trigger time to get the corrected power-on reset time $T(P_x)$. A computation formula is as follows:

$$T(P_x)=T(P)+(T_1-T_4)=(T_2-T_1)-(T_3-T_2)+(T_1-T_4)$$

Compared with the first embodiment, the power-on reset time in the present embodiment is corrected according to the reset trigger time of the power-on reset circuit, and accuracy of the computed power-on reset time is further improved. In addition, two specific implementations to obtain the reset trigger time of the power-on reset circuit are provided in this embodiment.

A third embodiment of the present disclosure relates to a system for measuring a power-on reset time, to measure the power-on reset time of a power-on reset circuit integrated into a chip, but is not limited thereto. Before measuring, a pulse output program needs to be written in a storage device or an external flash memory of the chip. The program is designed with a pulse output instruction as a first instruction executed after the chip is powered on. After the chip is powered on, and after the power-on reset time, the chip executes the pulse output instruction, and outputs a pulse with a preset width through a general purpose input/output (GPIO) of the chip. The pulse output program is also designed with a jump instruction, which, after the chip completes executing the pulse output program, may cause the chip to jump to the first instruction to re-execute the pulse output program. The pulse output program may be bootloaded by a Bootloader of the chip, or directly programed to an external executable flash memory and runs directly, and the chip is connected to the executable flash memory via an external bus.

Figure 7:
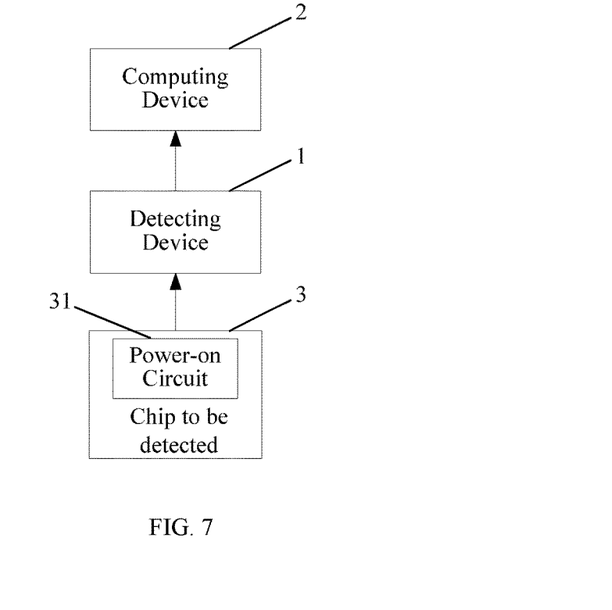
FIG. 7 is a block diagram of a system for measuring the power-on reset time in a third embodiment of the present disclosure.

With reference to FIG. 7, the system for measuring the power-on reset time includes a detecting device 1 and a computing device 2. The detecting device 1 may be an oscilloscope or a logic analyzer or the like, any type of the detecting device 1 is not limited in the present embodiment.

The detecting device 1 is connected to a power supply pin of the chip 3 for detecting a power supply pin voltage of the chip 3. A time point at which the power supply pin voltage reaches a preset voltage is recorded as a first time point $T_1$. That is, the time point, at which the detecting device 1 detects that the power supply pin voltage of the chip 3 gradually rises from 0V to reach and stabilize at the preset voltage, is recorded as the first time point $T_1$.

The detecting device 1 is connected to a preset pin of the chip 3 for detecting an output signal of the preset pin of the chip 3. When the detecting device 1 detects that the power supply pin voltage reaches and stabilizes at the preset voltage, a power-on reset circuit 31 is triggered. After the power-on reset time, the chip 3 performs the pulse output instruction and outputs a pulse signal from the preset pin (any GPIO), and the detecting device 1 records a time point at which a completion of a first pulse output of the detected output signal is detected for a first time after the chip 3 is powered on as a second time point $T_2$. Then, the chip 3 executes the jump instruction, and the chip 3 jumps to the first instruction (i.e. the pulse output instruction) to re-execute, and the detecting device 1 records a time point at which a completion of a second pulse output of the detected output signal is detected for a second time after the chip 3 is powered on as a third time point $T_3$. Since the chip 3 performs the same pulse output instruction, the width of the pulse output for the first time is the same with that of the pulse output for the second time.

The computing device 2 is used to compute the power-on reset time $T(P)$ of the chip 3 according to the first time point $T_1$, the second time point $T_2$ and the third time point $T_3$. The computing device 2, e.g., a host computer, a processor, etc., is connected to the detecting device 1 and obtains data from the detecting device 1, but is not limited thereto. The computing device 2 may also be a personal computer or any electronic device with computing ability. The computing device 2 and the detecting device 1 may also be integrated together so as to be a personal computer or any electronic device with ability to measure the power-on reset time.

With reference to FIG. 3, the entire process of measuring the power-on reset time includes three stages: a first stage refers to a power-on reset time $T(P)$; a second stage refers to a time $T_{GPIO1}$ from a time point that the chip executes the pulse output instruction to a time point that the chip completes the pulse output for the first time; a third stage refers to a time $T_{GPIO2}$ from a time point that the chip executes the pulse output instruction to a time point that the chip completes the pulse output for the second time.

According to each time point detected by the detecting device 1, the computing device 2 may obtain the following: the total time for completing the first and second stages during the entire process for measuring the power-on reset time, i.e., $T(P)+T_{GPIO1}=T_2-T_1$; the time for completing the third stage, i.e., $T_{GPIO2}=T_3-T_2$. Since the same pulse output instructions are executed in the second stage and the third stage respectively, the time to complete the second stage is equal to the time to complete the third stage, that is, $T_{GPIO1}=T_{GPIO2}$.

Therefore, the computing device 2 may compute the power-on reset time of the chip 3 according to a formula $T(P)=(T_2-T_1)-(T_3-T_2)$, wherein $T(P)$ is the power-on reset time of the chip 3, $T_1$ is the first time point, $T_2$ is the second time point, and $T_3$ is the third time point.

Since the first embodiment and the present embodiment correspond to each other, the present embodiment and the first embodiment may be implemented in cooperation with each other. Related technical details mentioned in the first embodiment are still effective in the present embodiment, and technical effects that may be achieved in the first embodiment may also be implemented in the present embodiment. In order to reduce repetition, details will not be described here again. Correspondingly, the related technical details mentioned in the present embodiment may also be applied to the first embodiment.

Compared with existing technologies, in the embodiment of the present disclosure, via software, the power supply pin voltage of the chip is detected, and the time point at which the power supply pin voltage reaches the preset voltage is recorded as the first time point. At this time, the power-on reset circuit 31 in the chip is triggered, and after the power-on reset time, the time point at which the completion of the first pulse output of the detected output signal is detected for the first time may be detected and recorded as the second time point, and the time point at which the completion of the first pulse output of the detected output signal is detected for the second time as the third time point (widths of the pulse output for the first time and for the second time are the same). Then, according to the relationship among the first time point, the second time point and the third time point, the power-on reset time may be measured more accurately, thereby improving the verification efficiency of the power-on reset circuit 31.

A fourth embodiment of the present disclosure relates to a system for measuring a power-on reset time. The present embodiment improves the third embodiment mainly in correcting the power-on reset time computed in the third embodiment according to a reset trigger time of a power-on reset circuit 31, with reference to FIG. 7.

A computing device 2 is also used for correcting the power-on reset time according to the reset trigger time of the power-on reset circuit 31 after the power-on reset time of the chip 3 is computed.

In the third embodiment, the computed power-on reset time is actually a reset pulse width time of the power-on reset circuit 31, but the reset trigger time of the power-on reset circuit 31 is not considered. In this embodiment, the power-on reset time is corrected according to the reset trigger time of the power-on reset circuit 31 to meet a requirement for higher precision. A specific way for the correction is to add the power-on reset time computed in the first embodiment with the reset trigger time to get a corrected power-on reset time.

In this embodiment, there are two ways that the computing device 2 obtains the reset trigger time of the power-on reset circuit 31.

In a first way, the reset trigger time of the power-on reset circuit 31 is set to a preset value, and the computing device 2 adds the computed power-on reset time to the preset value to get the corrected power-on reset time. The preset value may be preset in the chip as a default setting, and different preset values need to be set for different types of chips;

In a second way, the computing device 2 computes the reset trigger time by detecting time points of a power supply pin voltage of the chip 3, which is specifically as follows.

The detecting device 1 is further used for recording a time point at which the power supply pin voltage appears as a fourth time point $T_4$ during a process of detecting the power supply pin voltage of the chip 3. The time point at which the power supply pin voltage appears is a time point at which the detecting device 1 detects a sudden change in the power supply pin voltage.

The computing device 2 is specifically used for computing a time difference between the first time point $T_1$ and the fourth time point $T_4$, and takes the computed time difference as the reset trigger time of the power-on reset circuit 31 to correct the power-on reset time.

The computing device 2 may compute the time difference, i.e., $T_1-T_4$, between the first time point $T_1$ and the fourth time point $T_4$ according to the first time point $T_1$ and the fourth time point $T_4$ recorded by the detecting device 1. That is, the time difference is a time for the power supply pin voltage of the chip 3 rises from 0V to reach and stabilize at a preset voltage. Take the computed time difference as the reset trigger time of the power-on reset circuit 31, i.e., the reset trigger time of the power-on reset circuit 31 is $T_1-T_4$, and then, add the computed power-on reset time to the reset trigger time to get corrected power-on reset time $T(P_x)$, for which a computation formula is as follows:

$$T(P_x)=T(P)+(T_1-T_4)=(T_2-T_1)-(T_3-T_2)+(T_1-T_4)$$

Since the second embodiment and the present embodiment correspond to each other, the present embodiment and the second embodiment may be implemented in cooperation with each other. Related technical details mentioned in the second embodiment are still effective in the present embodiment, and technical effects that may be achieved in the second embodiment may also be implemented in the present embodiment. In order to reduce repetition, details will not be described here again. Correspondingly, the related technical details mentioned in the present embodiment may also be applied to the second embodiment.

Compared with the third embodiment, the power-on reset time is corrected in the present embodiment according to the reset trigger time of the power-on reset circuit, and accuracy of the computed power-on reset time is further improved. In addition, two specific implementations for obtaining the reset trigger time of the power-on reset circuit are provided.

A fifth embodiment of the present disclosure relates to a system for measuring a power-on reset time, to measure the power-on reset time of a power-on reset circuit integrated into a chip, but is not limited thereto. Before the measurement, a pulse output program needs to be written in a storage device or an external flash memory of the chip. The program is designed with a pulse output instruction as a first instruction executed after the chip is powered on. After the chip is powered on, and after the power-on reset time, the chip executes the pulse output instruction, and outputs a pulse with a preset width through a general purpose input/output (GPIO) of the chip. The pulse output program is also designed with a jump instruction, which, after the chip completes executing the pulse output program, may cause the chip to jump to the first instruction to re-execute the pulse output program. The pulse output program may be bootloaded by a Bootloader of the chip, or directly programed to an external executable flash memory and runs directly, and the chip is connected to the executable flash memory via an external bus. The system for measuring the power-on reset time includes at least one processor, and a memory that communicates with the at least one processor. The measuring system in the present embodiment may also be a personal computer or any electronic device with ability to measure the power-on reset time.

The memory stores instructions executable by the at least one processor, the instructions executed by the at least one processor to enable the at least one processor to execute the method for measuring the power-on reset time in the first embodiment or the second embodiment.

The memory and the processors are connected by a bus which may include any number of interconnected buses and bridges that connect various circuits with one or more processors and the memory together. The buses may also connect various other circuits such as peripherals, voltage regulators, and power management circuits together, which is well known in the art, and therefore, this will not be further described herein. A bus interface provides an interface between the bus and a transceiver. The transceiver may be an element or a plurality of elements, such as multiple receivers and transmitters, providing units for communicating with various other devices on a transmission medium.

The processor is used for managing the bus and general processing, and can also provide various functions including timing, peripheral interfaces, voltage regulation, power management, and other control functions. The memory may be used to store data used by the processor when executing operations.

Compared with existing technologies, in the embodiment of the present disclosure, the power supply pin voltage of the chip is detected, and the time point at which it is detected that the power supply pin voltage reaches a preset voltage is recorded as the first time point. At this time, the power-on reset circuit in the chip is triggered. After the power-on reset time, the time point at which the completion of the first pulse output of the detected output signal is detected for the first time can be detected and recorded as the second time point, and the time point at which the completion of the second pulse output of the detected output signal is detected for the second time is recorded as a third time point (widths of the pulses output for the first time and for the second time are the same). Then, according to the relationship among the first time point, the second time point, and the third time point, the power-on reset time can be accurately measured, thereby improving the verification efficiency of the power-on reset circuit.

Those skilled in the art should appreciate that the embodiments above are specific embodiments for implementing the present disclosure. In practice, however, many changes can be made in forms and details of the specific embodiments without departing from the spirit and scope of the present disclosure.

What is claimed is:

1. A method for measuring a power-on reset time, comprising:
   detecting a power supply pin voltage of a chip, and recording a time point at which the power supply pin voltage reaches a preset voltage as a first time point;
   detecting an output signal of a preset pin of the chip, and recording a time point at which a completion of a first pulse output of the detected output signal is detected for a first time after the chip is powered on as a second time point, and recording a time point at which a completion of a second pulse output of the detected output signal is detected for a second time after the chip is powered on as a third time point; wherein widths of the first and second pulse outputs for the first time and for the second time are the same; and
   computing the power-on reset time of the chip according to the first time point, the second time point and the third time point.

2. The method according to claim 1, wherein the step of computing the power-on reset time of the chip according to the first time point, the second time point and the third time point comprises:
   computing the power-on reset time of the chip according to a formula $T(P)=(T_2-T_1)-(T_3-T_2)$;
   wherein $T(P)$ is the power-on reset time of the chip, $T_1$ is the first time point, $T_2$ is the second time point, and $T_3$ is the third time point.

3. The method according to claim 1, further comprising:
   correcting the power-on reset time according to a reset trigger time of a power-on reset circuit, after the power-on reset time of the chip is computed.

4. The method according to claim 3, wherein the reset trigger time of the power-on reset circuit is a preset value.

5. The method according to claim 3, further comprising:
   recording a time point at which the power supply pin voltage appears as a fourth time point during a process of detecting the power supply pin voltage of the chip; and
   the step of correcting the power-on reset time according to the reset trigger time of the power-on reset circuit comprises:
   computing a time difference between the first time point and the fourth time point; and
   taking the computed time difference as the reset trigger time of the power-on reset circuit and correcting the power-on reset time.

6. A system for measuring a power-on reset time, comprising:
   a detecting device, configured for:
   detecting a power supply pin voltage of a chip, and recording a time point at which the power supply pin voltage reaches a preset voltage as a first time point; and
   detecting an output signal of a preset pin of the chip, recording a time point at which a completion of a first pulse output of the detected output signal is detected for a first time after the chip is powered on as a second time point, and recording a time point at which a completion of a second pulse output of the detected output signal is detected for a second time after the chip is powered on as a third time point, wherein widths of the first and second pulse outputs for the first time and for the second time are the same; and
   a computing device, configured for computing the power-on reset time of the chip according to the first time point, the second time point and the third time point.

7. The system according to claim 6, wherein the computing device computes the power-on reset time of the chip according to a formula $T(P)=(T_2-T_1)-(T_3-T_2)$;
   wherein $T(P)$ is the power-on reset time of the chip, $T_1$ is the first time point, $T_2$ is the second time point, and $T_3$ is the third time point.

8. The system according to claim 7, wherein the computing device is further configured for correcting the power-on reset time according to a reset trigger time of the power-on reset circuit, after the power-on reset time of the chip is computed.

9. The system according to claim 8, wherein the reset trigger time of the power-on reset circuit is a preset value.

10. The system according to claim 8, wherein the detecting device is further configured for recording a time point at which the power supply pin voltage appears as a fourth time point during a process of detecting the power supply pin voltage of the chip, and computing a time difference between the first time point and the fourth time point, taking the computed time difference as the reset trigger time of the power-on reset circuit, and correcting the power-on reset time.

11. The system according to claim 6, wherein the detecting device is an oscilloscope or a logic analyzer.

12. A system for measuring a power-on reset time, comprising at least one processor; and
a memory that communicates with the at least one processor, wherein
the memory stores instructions executable by the at least one processor, the instructions being executed by the at least one processor to enable the at least one processor to:
detect a power supply pin voltage of a chip, and record a time point at which the power supply pin voltage reaches a preset voltage as a first time point;
detect an output signal of a preset pin of the chip, and record a time point at which a completion of a first pulse output of the detected output signal is detected for a first time after the chip is powered on as a second time point, and record a time point at which a completion of a second pulse output of the detected output signal is detected for a second time after the chip is powered on as a third time point; wherein widths of the first and second pulse outputs for the first time and for the second time are the same; and
compute the power-on reset time of the chip according to the first time point, the second time point and the third time point.

13. The system according to claim 12, wherein the at least one processor is enabled to:
compute the power-on reset time of the chip according to a formula $T(P)=(T_2-T_1)-(T_3-T_2)$;
wherein $T(P)$ is the power-on reset time of the chip, $T_1$ is the first time point, $T_2$ is the second time point, and $T_3$ is the third time point.

14. The system according to claim 12, wherein the at least one processor is enabled to: correct the power-on reset time according to a reset trigger time of a power-on reset circuit, after the power-on reset time of the chip is computed.

15. The system according to claim 14, wherein the reset trigger time of the power-on reset circuit is a preset value.

16. The system according to claim 14, wherein the at least one processor is further enabled to:
record a time point at which the power supply pin voltage appears as a fourth time point during a process of detecting the power supply pin voltage of the chip;
compute a time difference between the first time point and the fourth time point; and
take the computed time difference as the reset trigger time of the power-on reset circuit and correct the power-on reset time.

* * * * *